United States Patent [19]
Taniguchi

[11] Patent Number: 5,935,330
[45] Date of Patent: Aug. 10, 1999

[54] AUTOMATIC WAFER PLATING EQUIPMENT

[75] Inventor: Kazuhiro Taniguchi, Hiratsuka, Japan

[73] Assignee: Electroplating Engineers of Japan Ltd., Tokyo, Japan

[21] Appl. No.: 08/901,209

[22] Filed: Jul. 28, 1997

[30] Foreign Application Priority Data

Jan. 24, 1997 [JP] Japan .................................. 9-011189

[51] Int. Cl.⁶ ...................................................... B05C 3/00
[52] U.S. Cl. .............................. 118/66; 118/407; 118/412; 118/423; 118/428; 118/429; 118/500; 414/222; 414/225; 414/936; 414/938; 414/940; 414/941; 134/902; 134/61
[58] Field of Search ............................. 118/66, 407, 412, 118/423, 428, 429, 500; 414/222, 225, 936, 938, 940, 941; 204/297 M, 224 R, 199, 123; 901/43; 134/902, 61; 427/430.1

[56] References Cited

U.S. PATENT DOCUMENTS

| | | | |
|---|---|---|---|
| 4,604,027 | 8/1986 | Becker et al. | 414/749 |
| 5,404,894 | 4/1995 | Shiraiwa | 118/500 |
| 5,570,994 | 11/1996 | Somekh et al. | 414/941 |

*Primary Examiner*—Laura Edwards
*Attorney, Agent, or Firm*—Michael D. Bednarek Crowell & Moring LLP

[57] ABSTRACT

An automatic wafer plating equipment for automatically plating wafers and more particularly, for automatically plating a small lot of wafers is disclosed. The automatic wafer plating equipment includes a transfer robot provided with a holding arm for pivoting, vertical movement, extending and extracting, a load stage, an orientation stage, a plating stage, a recovery stage, and a cleaning stage. The transfer robot carries out a series of the following operations for plating process. The wafers are picked up one by one from a supply cassette loaded to the load stage. The wafer is then fed to the orientation stage. The wafer orientated at the orientation stage is conveyed to the plating stage. The plated wafer is transferred from the plating stage to the recovery stage. When residue of a plating liquid has been recovered at the recovery stage, the wafer is conveyed to the cleaning stage.

4 Claims, 4 Drawing Sheets

AUTOMATIC WAFER PLATING EQUIPMENT

BACKGROUND OF THE INVENTION

1. Field of the Invention

The present invention relates to an automatic wafer plating equipment for automatically plating wafers, and particularly to an automatic wafer plating equipment suitable for automatically plating a small lot of wafers.

2. Earlier Technology

Semiconductor devices are fabricated through a number of processing steps. One of the steps is for plating wafers. It is common that a large lot of identical wafers are plated using a bulky, full-automatic plating equipment. A small lot of wafers are however plated with, for example, one or two cup-type plating equipments in which a series of pertinent plating steps are substantially carried out manually. Such manual actions in the plating steps for wafers are disadvantageous. For example, a wafer of which surface is touched by an operator can considerably produce a defective article. It is thus requested to develop an automatic wafer plating equipment capable of performing a series of steps for plating a small lot, namely several to dozens, of wafers which are free from being directly touched by an operator.

The present invention has been embodied for meeting the above demand and its object is to provide a wafer plating equipment for automatically plating wafers, and particularly to an automatic wafer plating equipment for automatically plating a small lot of wafers.

SUMMARY OF THE INVENTION

An automatic wafer plating equipment according to the present invention is based on picking up a number of wafers one by one from a supply cassette and subjecting them in a sequence to a series of plating steps.

The automatic wafer plating equipment according to the present invention comprises: a transfer robot having a horizontally retractable holding arm arranged for upward and downward movements, and pivotal movement about an axis of the upward and downward movements; and a group of a load stage, an orientation stage, a plating stage, a recovery-stage, and a cleaning stage which are all provided in a circle for surrounding the transfer robot where a gripper mounted to a distal end of the holding arm of the transfer robot can reach when the holding arm is extended to its maximum length.

For plating action, each wafer is subjected by the pivoting, vertical movement, extending and retracting of the holding arm of the transfer robot to feeding the wafer from the supply cassette to the load stage, locating the wafer in a given orientation at the orientation stage, conveying the orientated wafer located at the orientation stage to the plating stage, transferring the wafer plated at the plating stage to the recovery stage, and conveying the wafer to the cleaning stage after residue of a plating liquid is recovered.

The automatic wafer plating equipment allows the holding arm of the transfer robot to hold the wafer for transferring one stage to another for plating, hence eliminating direct touching of the wafer by any operator. Also, the wafers after the plating process is completed are received by a transfer cassette and unloaded from the apparatus, thus not permitting the operator to touch the wafer during transfer to the next step. Accordingly, the production of defective wafers which result from direct touching with fingers or hand of the operator will be prevented.

The automatic wafer plating equipment may further include a stage for drying the wafer after cleaning at the cleaning stage. It is also possible to carry out the drying step outside the automatic wafer plating equipment. Without a stage for drying step, the automatic wafer plating equipment can be miniaturized in the overall size, and it is practically preferable to do so.

In case that the drying stage is eliminated, t is preferable to place the transfer cassette at the cleaning stage for receiving and transferring the wafers from the plating step to the next step without the wafers being touched by an operator. It is additionally preferable that the cassette remains immersed in a cleaning liquid so that the given number of wafers should not get dry to produce dropping marks of the cleaning liquid on the wafers.

For the purpose, the automatic wafer plating equipment of the present invention has at the cleaning stage a cleaning tub filled with the cleaning liquid and a support member arranged for supporting the transfer cassette so that the cassette in the support member is moved out from the cleaning tub. The cassette is removed out from the cleaning tub only when receives the plated wafer and otherwise, remains immersed in the cleaning liquid of the cleaning tub before the succeeding wafer is received.

The plating stage in the automatic wafer plating equipment may incorporate a commonly used cup-type plating device. Such a cup-type plating equipment includes a support provided about the opening in an upper region of a cup-like plating tank, plating liquid discharge passages located lower to the support and communicating the inside with the outside of the plating tank, and a plating liquid supply inlet provided within the plating tank, whereby a surface being plated of the wafer placed on the support is directly exposed to an upward flow of the plating liquid supplied from the plating liquid supply inlet and discharged via the plating liquid discharge passages to the outside of the plating tank.

The present invention is not limited to the foregoing description and its other objects, advantages, features, and usage will be more apparent from the following description in conjunction with the accompanying drawings. It should be understood that appropriate modifications without departing from the spirit of the present invention fall within the scope of the present invention.

DETAILED DESCRIPTION OF THE PREFERRED EMBODIMENT

Figure 1:
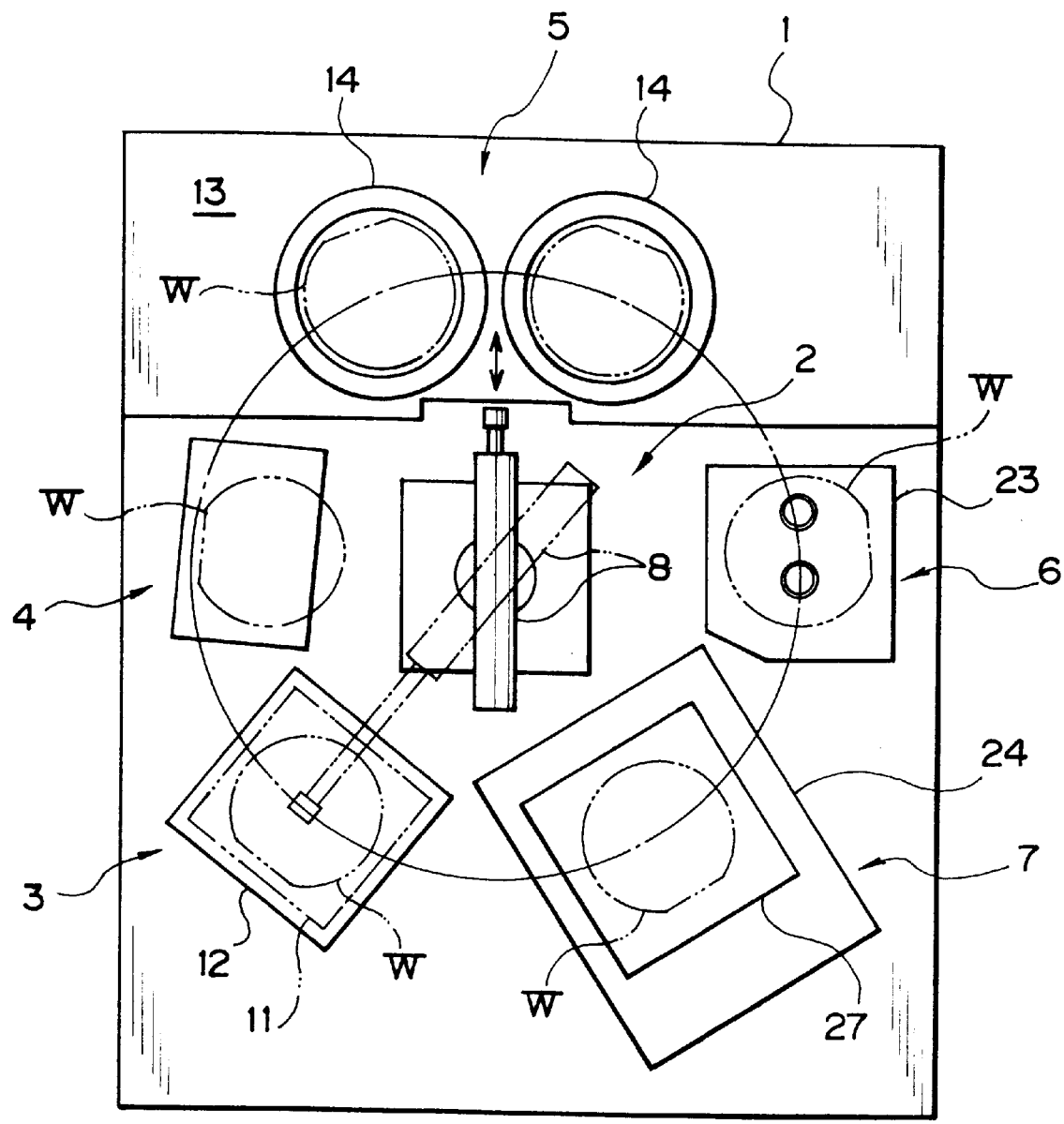
FIG. 1 is a schematic plan view of an automatic wafer plating equipment according to one embodiment of the present invention.

An embodiment of the present invention will be described. FIG. 1 is a schematic plan view of an automatic wafer plating equipment according to the present invention. As shown in FIG. 1, the automatic plating equipment of the present invention comprises a transfer robot 2 installed in a housing 1 which may serve as a clean room, and a group of stages arranged in substantially a circle about the transfer robot 2, including a load stage 3, an orientation stage 4, a plating stage 5, a recovery stage 6, and a cleaning stage 7. The stages are equally spaced from the center of the circle by a distance which allows a holding arm 8 of the transfer robot 2, described later, to reach with its distal end when extended as denoted by one-dot chain line in FIG. 1.

Figure 2:
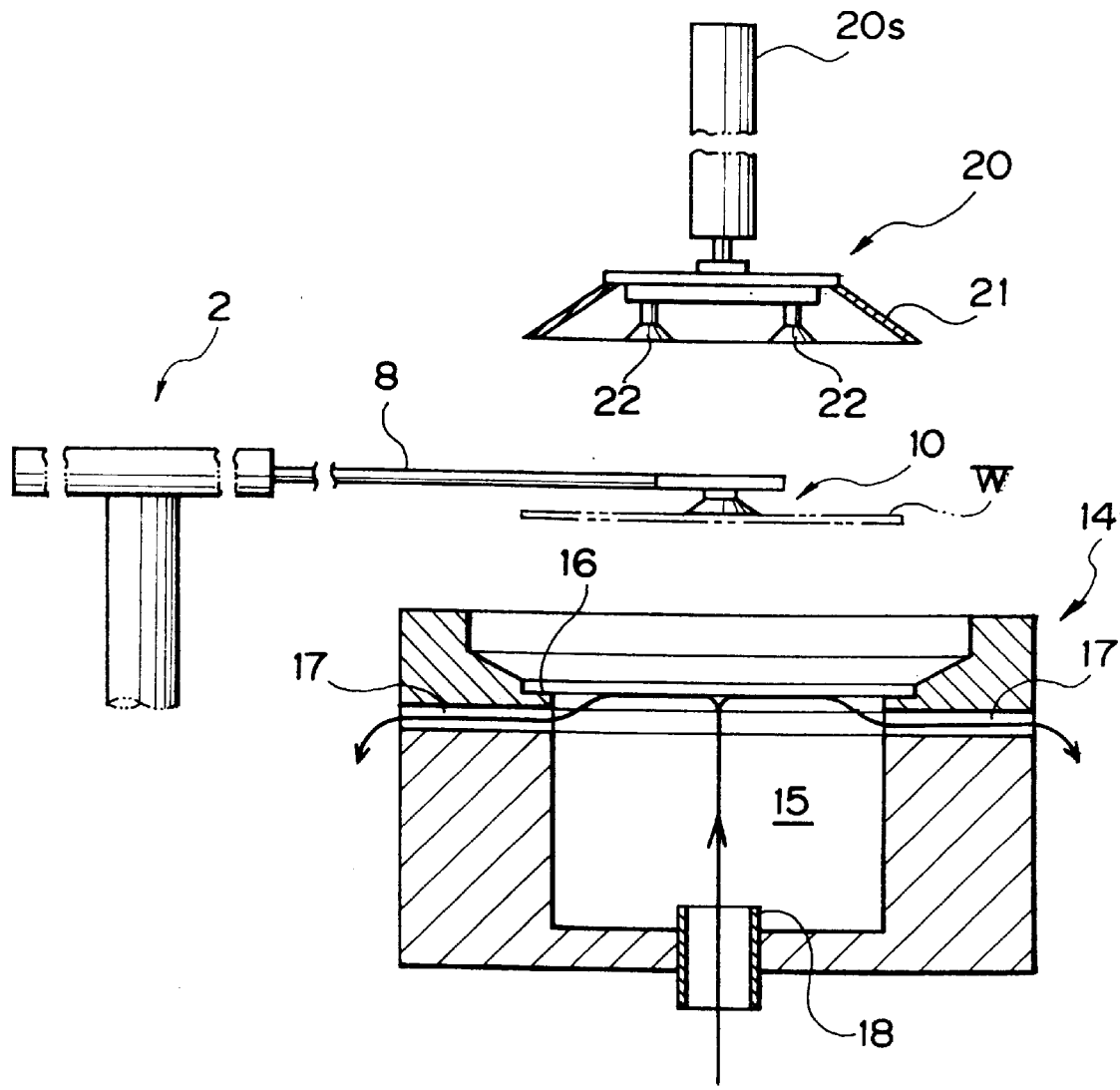
FIG. 2 is a view showing the relation between a plating tank and a pressing member at the plating stage of the automatic wafer plating equipment via a holding arm.

The holding arm 8 of the transfer robot 2 is designed for extending and extracting as denoted by a double-headed arrow in FIG. 1 and also, moving vertically. The arm can further perform pivotal movements about the axis of vertical movement. The holding arm 8 is provided at front end with a gripper 10 operated by suction as shown in FIG. 2.

The load stage 3 includes a table 12 for receiving a supply cassette 11 by which a wafer is carried from preceding steps before a plating process.

The orientation stage 4 includes an orientation flat aligner for orientation flat type wafers or a notch aligner for notch-type wafers. Either the orientation flat or notch aligner may be of a conventional model.

The plating stage 5 is located in a plating chamber 13 separated from the other stages. In the plating stage 5, a couple of tanks 14 in a cup-type plating equipment are arranged in a side-by-side relationship. As best shown in FIG. 2, the plating tank 14 has an annular support 16 arranged about and along an opening of a bath 15. Also, a number of radially extending plating liquid discharge passages 17 are formed beneath the annular support 16, and a plating liquid supply inlet 18 is provided in the bottom center of the bath 15. An upper flow of plating liquid is introduced from an unshown circulating system via the supply inlet 18 into the bath 15 to form streams as indicated by arrows. Accordingly, when a wafer W is supportably placed on the support 16, its surface to be plated is exposed to or contacted with the plating liquid running through the discharge paths 17 to the outside of the tank 14 for plating.

The plating stage 5 is also provided with a pressing member 20 including e.g. an air cylinder 20s for upward and downward movement. The pressing member 20 has an elastic press-down skirt 21 made of a rubber sheet and a set of suction holders 22 located in the press-down skirt 21. The suction holders 22 may be four which are located in square relationship.

The edge wall of the plating tank 14 is leveled higher than the support 16. More specifically, the support 16 is surrounded by the edge wall. As will be apparent from FIG. 2, when lowered, the arm 8 holding the wafer W will strike against the edge wall, and which fact will not permit the wafer W to be placed on the support 16. Thus, the wafer W is transferred from the holding arm 8 to the pressing member 20 over the plating tank 14 as will be explained later in more detail.

The recovery stage 6 has a plating liquid recovery device 23 which is designed for spraying a recovery liquid from below towards the plated surface of the wafer.

Figure 3:
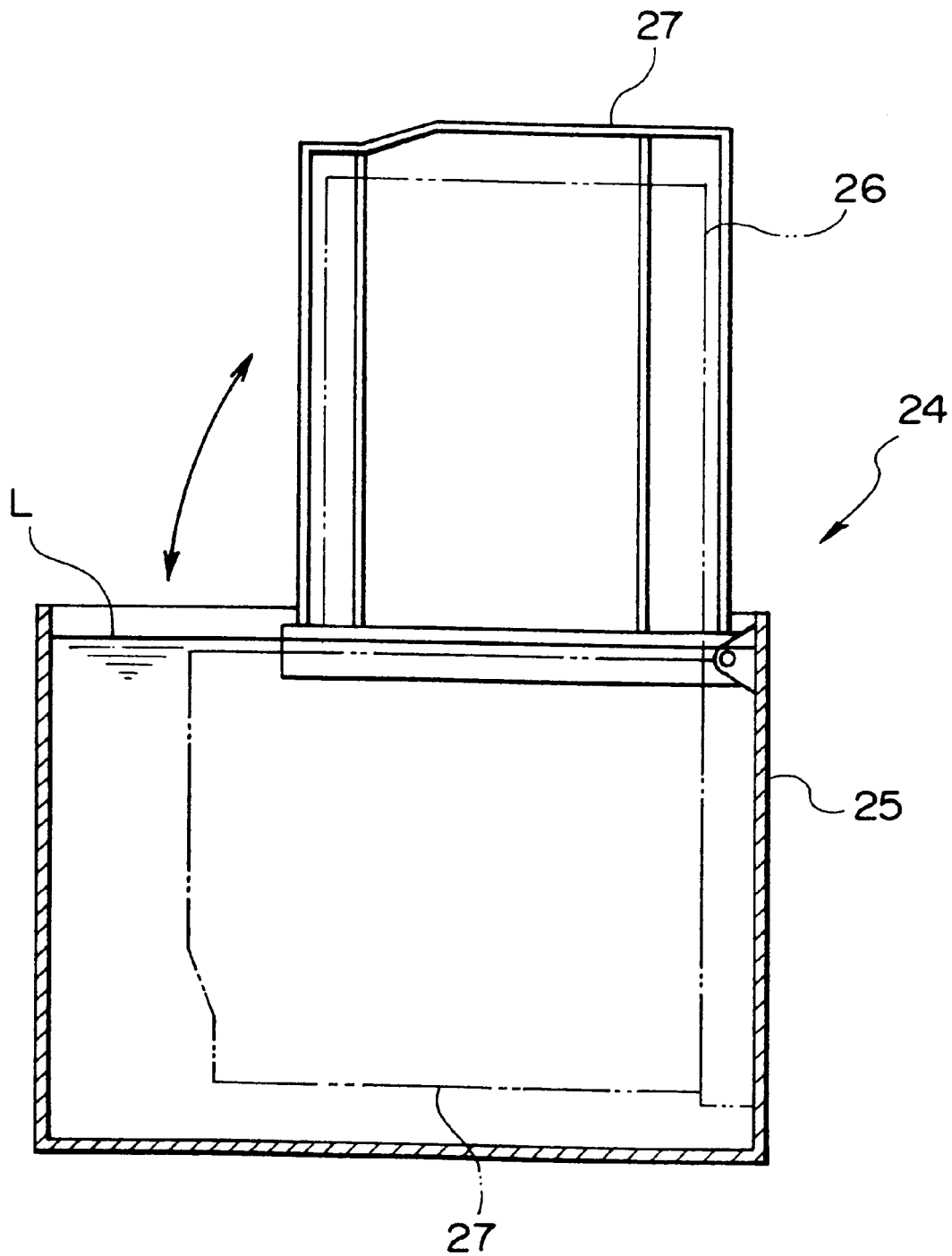
FIG. 3 is a cross sectional view of a cleaner at the cleaning stage of the automatic wafer plating equipment.

The cleaning stage 7 incorporates a cleaner 24 shown in FIG. 3. The cleaner 24 comprises a cleaning tub 25 filled with cleaning liquid L, and a support member 27 for holding a conveying cassette 26. The support member 27 has a specific structure such as a cage for allowing the cleaning liquid to freely pass through. More particularly, the support member 27 is pivotably mounted by e.g. a hinge to the cleaning tub 25 for pivotal movement as denoted by a double-headed arrow in FIG. 3. This allows the support member 27 to assume a standing state, denoted by a real line, out of the cleaning tub 25 and at an immersed state, denoted by a two-dot chain line, in the cleaning liquid in the cleaning tub 25.

Figure 4:
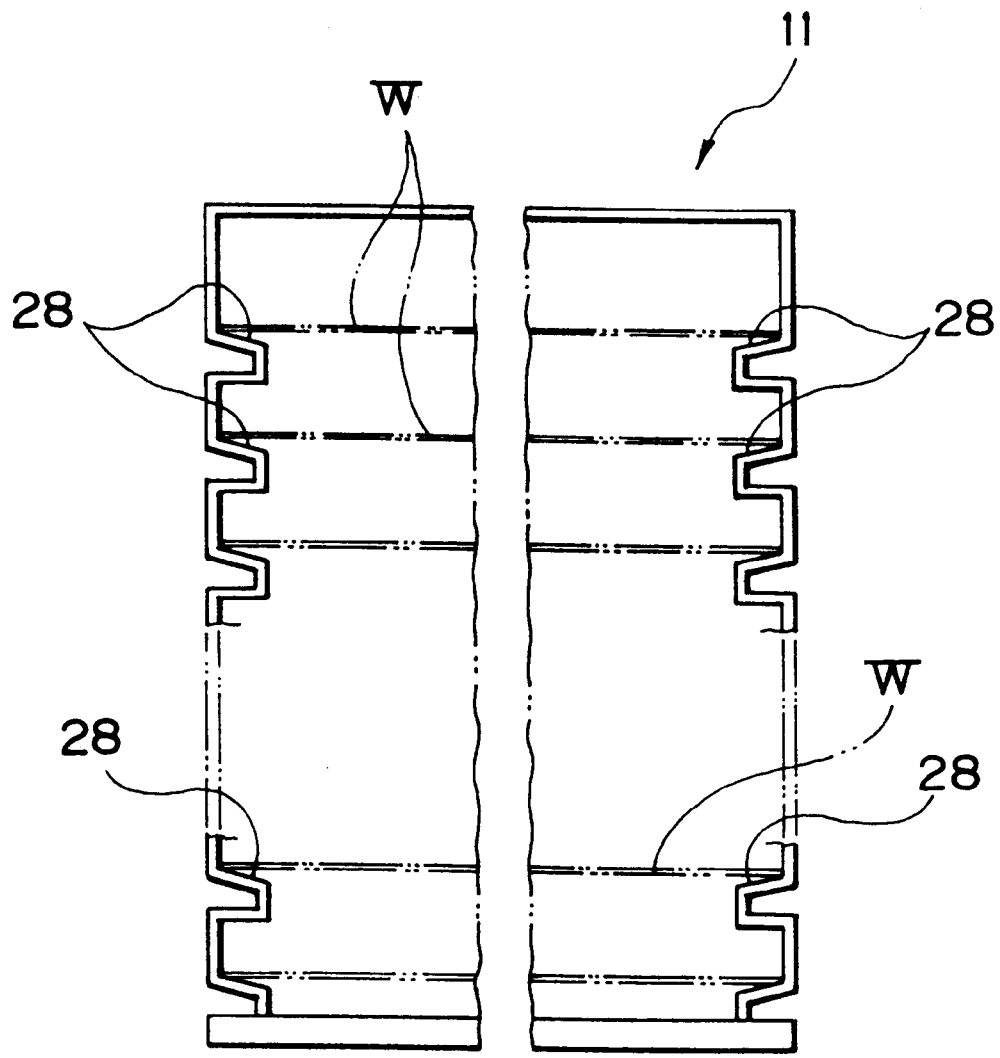
FIG. 4 is a schematic view of a cassette.

Plating in the automatic plating equipment of the present invention is as follows. After the preceding procedures, a group of wafers carried in the cassette 11 are loaded at the load stage 3. The cassette 11 may have such a construction as shown in FIG. 4, namely of a tubular construction having support steps 28 on which the wafers W are placed at their edge. Preferably, the wafers W are spaced from each other by approximately 10 mm.

When the supply cassette 11 has been loaded to the load stage 3, the transfer robot 2 is actuated by a controller such as a computer to locate its holding arm 8 to the load stage 3 and lift the cassette 11 to the level of a wafer W to be picked up from the cassette 11. The holding arm 8 is then extended with its gripper 10 substantially up to the center of the wafer W. The wafer W is held by suction with the gripper 10 of the holding arm 8 and removed out from the supply cassette 11.

The transfer robot 2 then feeds the wafer W from the cassette 11 to the orientation stage 4. More specifically, the holding arm 8 of the transfer robot 2 is retracted, pivoted, and directed towards the orientation stage 4. As the holding arm 8 has been lifted to a given level, it is extended to the orientation flat aligner or notch aligner in the orientation stage 4.

After a orientation flat or a notch of the wafer has been aligned in the orientation stage 4, the wafer is conveyed by the transfer robot 2 to an available one of the two plating tanks 14, 14. The wafer is then transferred from the holding arm 8 of the transfer robot 2 to the pressing member 20 over the plating tank 14. More particularly, the transfer robot 2 pivots, moves up and down, extends, and retracts so that the wafer held by the holding arm 8 is positioned over the plating tank 14. The pressing member 20 is then lowered to receive with its suction holders 22 the wafer from the holding arm 8. The pressing member 20 carrying the wafer is further lowered so that the wafer is placed under pressure on the support 16 of the plating tank 14 (FIG. 2). The plating process in the plating tank 14 is then commenced.

When the plating process in the plating tank 14 is completed, the pressing member 20 carrying the wafer is lifted up and returns the wafer to the holding arm 8 of the transfer robot 2 in the manners reverse to the above. This is followed by pivoting, lifting, lowering, extending and retracting of the holding arm 8 of the transfer robot 2 to convey the plated wafer to the recovery stage 6. At the recovery stage 6, a recovery liquid is sprayed over the plated surface of the wafer to recover the plating liquid which may contain plating metal such as gold adhered to the wafer.

The wafer after the recovery process is conveyed to the cleaning stage 7 by the like action of the transfer robot 2. At the cleaning stage 7, the plated wafer is loaded in a transfer cassette 26 held in the support member 27 of the cleaner 24. More specifically, the wafer is loaded into the cassette 26 with the support member 27 staying at the standing state as denoted by a solid line in FIG. 3. Other than the loading of the plated wafer into the cassette 26, the support member 27 with the cassette 26 remains immersed in the cleaning liquid in the cleaning tub 25 as denoted by the two-dot chain line in FIG. 3. When the cassette 26 has been filled with a given number of the plated wafers, it is removed out from the support member 27 and conveyed to the succeeding station.

As set forth above, the automatic wafer plating equipment of the present invention is characterized by a combination of picking up a group of the wafers one by one from the supply cassette, subjecting them in a sequence to a series of plating steps, having the stages for the plating steps arranged in a circle about the transfer robot, allowing the transfer robot to convey the wafer from one stage to another. The plating equipment of the invention prevents the finger or hand of an operator from directly touching the surface of a wafer to eliminate production of detectives, and will ensure effective actions in the plating steps thus contributing to the improvement of the quality of plating and the Productivity of plated wafers particularly in a small lot.

What is claimed is:

1. An automatic wafer plating apparatus for picking up a plurality of wafers one by one from a supply cassette and subjecting them in a sequence to a series of plating steps, comprising:

a transfer robot having a horizontally retractable holding arm arranged for vertical movement, and pivotal movement about an axis of the vertical movement; and a group of a load stage, an orientation stage, a plating stage, a recovery stage, and a cleaning stage all provided in a circle about the transfer robot where a gripper mounted to a distal end of the holding arm of the transfer robot can reach when the holding arm is extended to its maximum length, wherein a combination of the pivoting, vertical movement, extending and retracting of the holding arm of the transfer robot carries out operations sequentially per wafer; holding and picking up a wafer from the supply cassette positioned on the load stage; locating the wafer in a given orientation at the orientation stage; conveying the orientated wafer located at the orientation stage to the plating stage; transferring the wafer plated at the plating stage to the recovery stage; and conveying the wafer to the cleaning stage after residue of a plating liquid is recovered.

2. An automatic wafer plating apparatus according to claim 1, wherein the cleaning stage comprises a cleaning tub filled with a cleaning liquid and a support member movable with respect to the cleaning tub and for supporting a transfer cassette, said cassette can be taken out from the cleaning tub only when receiving the wafer, and otherwise remains immersed in the cleaning liquid in the cleaning tub before a succeeding wafer is received.

3. An automatic wafer plating apparatus according to claim 2, wherein the support member is pivotably mounted to the cleaning tub, thereby allows the transfer cassette to be housed and taken out from the cleaning tub integrally with said support member.

4. An automatic wafer plating apparatus according to claim 1, wherein the plating stage incorporates a cup plating device which includes a support provided about an opening in an upper region of a cup plating tank, plating liquid discharge passages located lower to the support and communicating the inside and outside of the plating tank, and a plating liquid supply inlet provided within the plating tank, whereby a surface being plated of the wafer placed on the support is directly exposed to an upward flow of the plating liquid supplied from the plating liquid supply inlet and discharged via the plating liquid discharge passages to the outside of the plating tank.

* * * * *